United States Patent [19]

Stamminger et al.

[11] 4,410,757
[45] Oct. 18, 1983

[54] ADJUSTABLE COLLECTION MEMBERS FOR SOLAR ENERGY SYSTEMS

[75] Inventors: Reinhard Stamminger, Gaithersburg; Herbert M. Cullis, Silver Spring, both of Md.

[73] Assignee: Monegon, Ltd., Gaithersburg, Md.

[21] Appl. No.: 360,790

[22] Filed: Mar. 22, 1982

[51] Int. Cl.³ .......................... H01L 31/04; F24J 3/02
[52] U.S. Cl. .................................. 136/248; 136/246; 126/424
[58] Field of Search ................. 136/248, 246; 126/424, 126/449

[56] References Cited

U.S. PATENT DOCUMENTS 4,187,123  2/1980  Diggs ................................. 136/206
4,235,221  11/1980  Murphy ............................. 126/415

OTHER PUBLICATIONS

M. Simon et al., "Solar Cells With Concentrating Collectors & Integrated Heat Use System", *Proceedings, 2nd E.C. Photovoltaic Solar Energy Conf.* (1979), Reidel Pub. Co. (1979), pp. 541-549.

*Primary Examiner*—Aaron Weisstuch
*Attorney, Agent, or Firm*—Herman L. Gordon

[57] ABSTRACT

A solar energy collecting assembly consisting of a rectangular supporting frame with a plurality of vane structures mounted in parallel relationship therein. Each vane structure consists of a generally Z-shaped bar member of extruded aluminum with an integral conduit at the corner between the lower flange and the web of the bar member. The conduit has extended end portions pivotally engaged through the front and rear supporting frame elements and these end portions are clampingly communicatively connected to respective inlet and outlet liquid manifolds located outwardly adjacent the front and rear frame elements. Each vane structure has a top flange provided with a blackened surface acting as a radiation absorber which generates heat, this heat being conducted to the associated conduit via the adjacent web portion of the bar member. The lower flange has an array of photovoltaic cells mounted thereon which can receive solar radiation either directly or via a plane mirror surface provided on the adjacent web portion of the vane structure. The coupling means connecting the conduit end portions to the manifolds includes coupling sleeves with surrounding clamps having tightening screws. The screws are employed for locking the vane structures in pivotally adjusted positions relative to the supporting frame, so that the vane structures can be set for optimum orientation. Each vane structure includes a block of heat-insulating material surrounding its conduit and covering the bottom surfaces of its web and flanges, to minimize heat loss.

11 Claims, 5 Drawing Figures

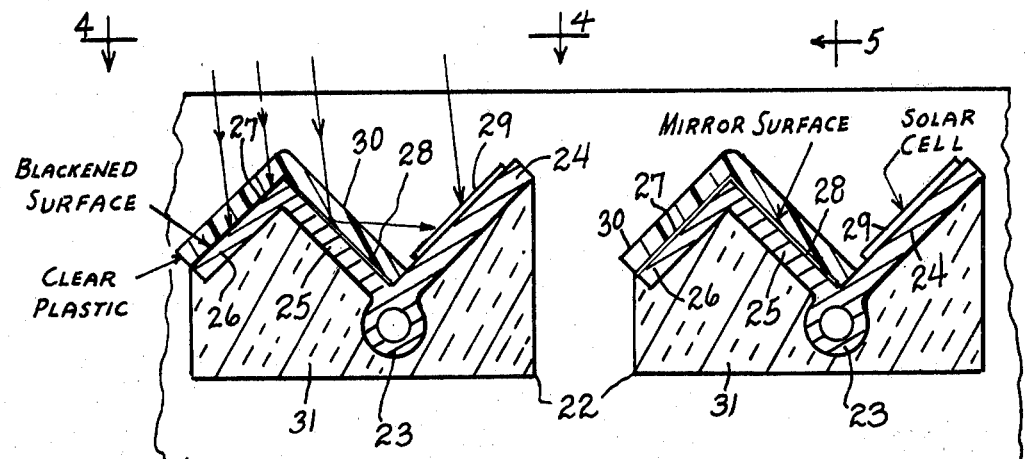
FIG.3
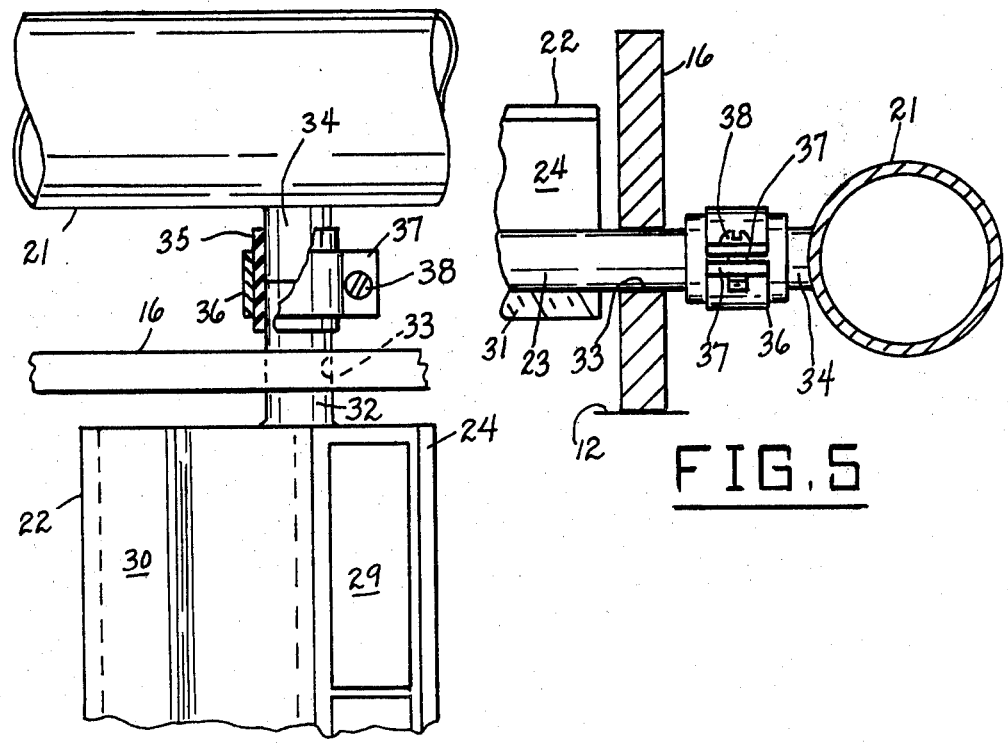
FIG.4
FIG.5

ADJUSTABLE COLLECTION MEMBERS FOR SOLAR ENERGY SYSTEMS

FIELD OF THE INVENTION

This invention relates to solar energy collecting systems, and more particularly to a combined thermal and electrical energy collection system with adjustable collection members which can be oriented for optimum efficiency.

BACKGROUND OF THE INVENTION

The collection of thermal energy by means of fluid-filled members exposed to incident solar energy is broadly well known. Conversion of solar incident energy to electrical energy by photovoltaic devices is also broadly well known. Also well known is the use of reflecting surfaces to gather and increase the amount of solar energy incident upon both thermal and photovoltaic collecting devices. The combination of both thermal and photovoltaic collectors in a common assembly has been typically described, for example, in U.S. Pat. No. 2,946,945 to N. J. Regnier et al, and No. 4,056,405 to P. F. Varadi.

In the prior art, there have been a number of schemes proposed for improving the efficiency of collection of solar energy utilizing fixed reflectors. In U.S. Pat. No. 3,419,434 to E. W. Colehower, a sheet of metal with zig-zag corrugations is utilized to reflect solar radiation onto photovoltaic devices for the purpose of increasing energy collection efficiency. In another such disclosure, U.S. Pat. No. 3,427,200, to E. E. Lapin et al, there is employed a light concentrating means that permits reflection of light from many angles and from many surfaces onto a non-adjustable fixed array of photovoltaic cells. Another disclosure is found in U.S. Pat. No. 3,923,381 to R. Winston, which describes a means of collecting and concentrating solar energy from a relatively large aperture onto a relaively small surface, utilizing trough-shaped reflecting surfaces. Reduction of cost by utilizing lightweight plastic materials in the construction of a non-tracking solar energy collector is described in U.S. Pat. No. 4,024,852, to P.M. L'Esperance et al.

The structures of the prior art have serious disadvantages, mainly in that they are relatively difficult to fabricate and employ collection elements that cannot be easily oriented relative to their supports for optimum efficiency so as to enable a given design to be employed for a wide range of roof conditions and geographical locations. Also, they do not have provision for adjusting their collection elements to be as nearly sun-facing as possible without moving the supporting frame of the assembly. Therefore, there is a definite need for an improved system which eliminates these disadvantages.

SUMMARY OF THE INVENTION

Accordingly, a main object of the invention is to provide a novel and improved adjustable combined thermal and electrical solar energy collection assembly which overcomes the deficiencies and disadvantages of the previously known solar energy collector systems.

A further object of the invention is to provide an improved solar energy collection device which is economical to manufacture, which is easy to install, and which can be mounted in a desired orientation on any surface and has provision for adjusting its photovoltaic conversion members to be as nearly sun-facing as possible without moving the supporting frame of the device.

A still further object of the invention is to provide an improved solar energy collecting assembly of the type employing combination thermal and electrical energy collection elements, the elements being of a configuration to maximize solar exposure thereof and heat collection for transmission to an associated fluid circuit, which provides substantially maximum utilization of its overall solar exposure roof area as well as optimum transfer of photons to its associated photovoltaic cells, and which is easily adjustable to properly orient the collection elements relative to their supporting frame so as to maximize solar collection for each element.

A still further object of the invention is to provide an improved solar energy collection assembly which employs pivotally adjustable parallel collection vanes which can be easily locked in optimum positions for solar energy reception by the use of very simple tools and with small physical exertion on the part of the installer.

A still further object of the invention is to provide an improved combination thermal and photovoltaic solar energy collecting assembly which is durable in construction, which is neat in appearance, which employs vane elements capable of fabrication by extrusion, whereby to facilitate economical manufacture, and which can be rapidly installed and adjusted for efficient operation.

BRIEF DESCRIPTION OF THE DRAWINGS

Further objects and advantages of the invention will become apparent from the following description and claims, and from the accompanying drawings, wherein:

FIG. 3 is an enlarged fragmentary vertical cross-sectional view taken substantially on line 3—3 of FIG. 2.

FIG. 4 is a fragmentary top plan view taken substantially on line 4—4 of FIG. 3.

FIG. 5 is a fragmentary transverse vertical cross-sectional view taken substantially on line 5—5 of FIG. 3.

DETAILED DESCRIPTION OF A PREFERRED EMBODIMENT

Figure 1:
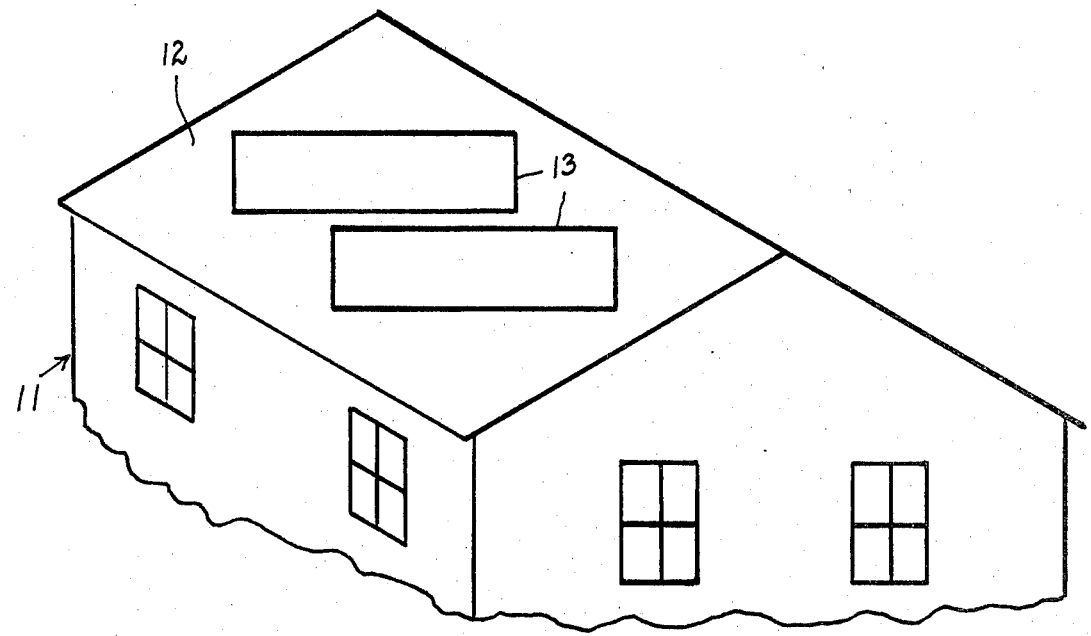
FIG. 1 is a perspective view of the upper portion of a typical building on the roof of which are installed a pair of combined thermal and electrical solar energy collection assemblies according to the present invention, said assemblies being shown in block form.
Figure 2:
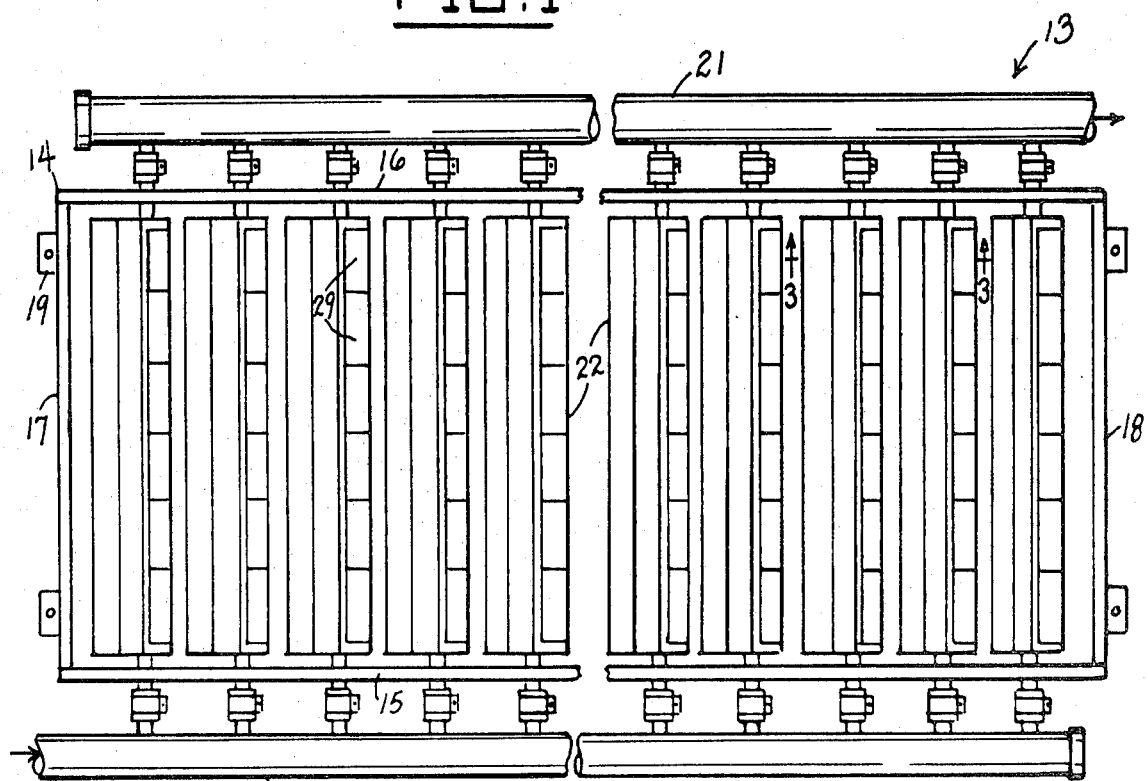
FIG. 2 is an enlarged fragmentary top plan view of one of the solar energy collection assemblies of FIG. 1.

Referring to the drawings, and more particularly to FIGS. 1 and 2, 11 designates a typical building having a sloping roof portion 12 on which are mounted a pair of combined thermal and electrical solar energy collection units 13, 13 constructed in accordance with the present invention, said units 13 being fastened on the roof in positions considered to be most favorable for reception of solar radiation, relative to the particular orientation of the building 11.

Each solar energy collection unit 13 comprises a generally rectangular main supporting frame 14 having vertical front and rear walls 15, 16 and opposite vertical end walls 17, 18, the walls being rigidly secured together at right angles at the respective corners of the frame. The opposite end walls 17, 18 are provided with suitable anchoring means, such as apertured lugs 19 for fastening the supporting frame 14 to the roof portion 12.

An inlet manifold 20 for liquid to be heated is provided outwardly adjacent and parallel to front wall 15, and a liquid outlet manifold 21 is provided outwardly adjacent and parallel to the rear wall 16. The manifolds 20, 21 are connected in a conventional manner to the heat utilization system of the building 11.

Pivotally mounted in the front and rear walls 15, 16 in a manner presently to be described, are a plurality of uniformly spaced, transversely-extending, solar energy collection assemblies comprising vane structures 22, said vane structures being located relatively closely adjacent to each other, but with sufficient clearance therebetween to allow a wide range of pivotal adjustment and to present substantially no obstruction to solar rays travelling past one vane structure to the next adjacent vane structure. A typical example of such spacing is illustrated in FIG. 3. Thus, the spacing between the pivotal axes of the vane structures may, for example, be between one and two times the maximum outer radius dimension of the vane structures.

Each vane structure 22 comprises a main body of generally Z-shaped cross-section, in the form of an aluminum extrusion having a longitudinal tubular bottom corner portion 23, a first longitudinal flange 24 extending upwardly and rightwardly from corner portion 23, as viewed in FIG. 3, a longitudinal web portion 25, extending upwardly and leftwardly from and being substantially perpendicular to flange 24, and a second longitudinal flange 26 extending downwardly and leftwardly from the top edge of web 25 substantially perpendicularly thereto. Flange 26 is thus substantially parallel to and offset upwardly from flange 24 and is preferably approximately of the same width, although variations in width may be made within the spirit of the present invention.

The top surface of flange 26 is provided with a blackened thin plastic cover layer 27, which causes flange 26 to act as a radiant heat absorber. The top surface of web 25 is provided with a thin reflective plastic layer 28, which causes web 25 to act as a plane mirror which reflects solar rays toward flange 24. The top surface of flange 24 is provided with an array of photovoltaic cells 29, which act to generate electrical current concurrently with the collection of heat by the heat-absorbing flange 26.

The absorbed heat is transmitted via web 25 to the liquid conduit 23, and the photovoltaic current generated in the cells 29 is transmitted by conventional wiring, not shown, to storage batteries for utilization in the electrical system of the building. The blackened surface layer 27 and the mirror surface layer 28 are protected by a layer of clear transparent plastic material 30 secured thereon and covering their combined areas.

A block of heat-insulating material 31, such as Styrofoam, or the like, is molded around the conduit 23 and to the under surfaces of flange 24, web 25 and flange 26 to minimize heat loss from these elements.

The aluminum extrusion forming the main body of each vane structure is machined away at each end around the conduit 23 to define tubular shaft elements 32 which are rotatably received in transversely aligned bearing apertures 33 formed in the front and rear walls 15 and 16, so as to rotatably support the vane structures. The manifolds 20 and 21 are formed with laterally projecting conduits 34 registrable with the tubular shaft elements 32, which are coupled thereto by short rubber sleeves 35 surrounded by relatively wide C-shaped clamps 36 having end flanges 37 connected together by clamping screws 38. This enables the vane structures 22 to be individually clamped in adjusted rotated positions around the transverse axes defined by the mating tubular conduits 32, 34. It is therefore possible to adjust the rotated positions of the individual vane structures 22 to provide the optimum orientations of the vane structures for each particular installation of solar collection units 13. With the clamps 36 tightened, the vane structures 22 are rigidly linked by the opposite manifolds 20, 21 and are thereby retained in optimum adjusted orientations.

In operation, solar light rays impinging on the blackened surface lining 27 of flange 26 will be absorbed, and transfer of heat from flange 26 to conduit 23 will take place. Solar light rays will either impinge directly on the photovoltaic cells 29 or will be reflected thereto by the reflective surface 28 on web 25, causing generation of photovoltaic current, which is transmitted to the current storage means of the system. The solar energy system will therefore operate effectively over a wide range of sun positions.

While a specific embodiment of an improved solar energy collection system has been disclosed in the foregoing description, it will be understood that various modifications within the scope of the invention may occur to those skilled in the art. Therefore it is intended that adaptations and modifications should and are intended to be comprehended within the meaning and range of equivalents of the disclosed embodiment.

What is claimed is:

1. In a solar energy collection system, a supporting frame, at least one vane structure transversely mounted in said supporting frame, said vane structure comprising a generally Z-shaped bar member of heat-conducting material having oppositely extending top and bottom longitudinal flanges and a longitudinal web portion connecting said flanges, said bar member being formed with a longitudinal tubular conduit having extended opposite end portions supportingly engaged with said frame, one of said flanges having a darkened top surface, whereby to absorb solar radiant energy to convert it into heat which is conducted to said conduit, and photovoltaic means mounted on the top surface of the other flange in a position to receive solar radiation and thereby generate electrical current.

2. The energy collection system of claim 1, and wherein said vane structure is pivotally mounted in said supporting frame at said conduit end portions, and means for clamping said vane structure in a pivotally adjusted position relative to said frame.

3. The energy collection system of claim 1, and wherein said supporting frame has substantially parallel front and rear elongated frame elements, and wherein said extended opposite conduit end portions are pivotally engaged in said frame elements.

4. The energy collection system of claim 1, and wherein said conduit is located at the bottom longitudinal corner of the bar member between the web portion and the lower flange of the bar member.

5. The energy collection system of claim 1, and wherein the photovoltaic means is mounted on the lower flange of the bar member, and wherein the web portion has a reflective surface facing said photovoltaic means.

6. The energy collection system of claim 1, and wherein said supporting frame has substantially parallel front and rear elongated frame elements, respective inlet and outlet liquid manifolds outwardly adjacent said front and rear frame elements, said extended conduit opposite end portions extending through said front and rear frame elements, and means communicatively connecting said conduit end portions to the respective liquid manifolds.

7. The energy collection system of claim 6, and wherein said conduit end portions extend pivotally through said front and rear frame elements, and wherein said communicatively connecting means includes means to clamp the vane structure in a pivotally adjusted position relative to the supporting frame.

8. The energy collection system of claim 1, and heat insulation material secured to and covering the bottom surfaces of said flanges and web portion and surrounding and covering said longitudinal tubular conduit.

9. The energy collection system of claim 1, and wherein said system comprises a plurality of said vane structures mounted in substantially parallel relationship in said supporting frame.

10. The energy collection system of claim 9, and wherein said supporting frame has front and rear elongated frame elements, the conduit end portions extending pivotally through said front and rear frame elements, respective liquid inlet and outlet manifolds outwardly adjacent said front and rear frame elements, and means communicatively connecting said conduit end portions to said respective manifolds.

11. The energy collection system of claim 10, and wherein said communicatively connecting means includes means to clamp the respective vane structures in pivotally adjusted positions relative to the supporting frame.

* * * * *